United States Patent
Torkington et al.

(10) Patent No.: US 7,489,022 B2
(45) Date of Patent: Feb. 10, 2009

(54) RADIO FREQUENCY OVER-MOLDED LEADFRAME PACKAGE

(75) Inventors: Richard S Torkington, Mesa, AZ (US); Michael R Lyons, Gilbert, AZ (US); Kenneth V Buer, Gilbert, AZ (US)

(73) Assignee: Viasat, Inc., Carlsbad, CA (US)

( * ) Notice: Subject to any disclaimer, the term of this patent is extended or adjusted under 35 U.S.C. 154(b) by 187 days.

(21) Appl. No.: 11/161,420

(22) Filed: Aug. 2, 2005

(65) Prior Publication Data
US 2007/0029647 A1    Feb. 8, 2007

(51) Int. Cl.
*H01L 23/495* (2006.01)

(52) U.S. Cl. .................... 257/666; 257/666; 438/106

(58) Field of Classification Search ........... 257/666, 257/676, E23.124, E23.004, E23.043, E21.512, 257/778, 723, 777, E25.011, E23.092, 700, 257/784, 692, E23.041, E23.046, E23.174, 257/E33.066, E23.065; 438/106
See application file for complete search history.

(56) References Cited

U.S. PATENT DOCUMENTS

| 5,663,597 | A  | * | 9/1997 | Nelson et al. | 257/734 |
| 7,180,161 | B2 | * | 2/2007 | Chiang et al. | 257/666 |
| 2002/0027297 | A1 | * | 3/2002 | Ikenaga et al. | 257/784 |
| 2004/0173881 | A1 | * | 9/2004 | Harnden et al. | 257/666 |
| 2004/0256707 | A1 | * | 12/2004 | Sugimori | 257/678 |
| 2005/0045986 | A1 | * | 3/2005 | Koo et al. | 257/531 |
| 2005/0121752 | A1 | * | 6/2005 | Lee | 257/666 |
| 2005/0248006 | A1 | * | 11/2005 | Corisis | 257/666 |
| 2005/0260787 | A1 | * | 11/2005 | Punzalan et al. | 438/106 |

FOREIGN PATENT DOCUMENTS

WO    WO2004025695    3/2004

OTHER PUBLICATIONS

International Search Report dated Sep. 1, 2006.
Agar, Jr., Bill T., Deborah S. Bowser, Kenneth V. Buer and David W. Corman. "A Novel High Frequency Bond Wire Interface." Technical Developments, vol. 21, Feb. 1994, pp. 102-103.

* cited by examiner

*Primary Examiner*—Steven Loke
*Assistant Examiner*—Tram H Nguyen
(74) *Attorney, Agent, or Firm*—Snell & Wilmer, LLP

(57) ABSTRACT

An over-molded leadframe (e.g., a Quad Flat No-lead (QFN)) package capable of operating at frequencies in the range of about five gigahertz (GHz) to about 300 GHz and a method of making the QFN package are disclosed. The QFN package includes a capacitance lead configured to substantially reduce and/or offset the inductance created by one or more wirebonds used to connect an integrated circuit (IC) chip on the package to an input/output (I/O) lead. The IC chip is connected to the capacitance lead via one or more wirebonds, and the capacitance lead is then connected to the I/O lead via at least a second wirebond. Thus, inductance created by the one or more wirebonds on the package is substantially reduced and/or offset by the capacitance lead prior to a signal being output by the package and/or received by the IC chip.

22 Claims, 9 Drawing Sheets

RADIO FREQUENCY OVER-MOLDED LEADFRAME PACKAGE

FIELD OF INVENTION

The present invention generally relates to millimeter-wave packaging, and more particularly, to quad flat no-lead (QFN) packages.

BACKGROUND OF INVENTION

Currently, low cost component packaging includes the use of ceramic bolt-down packages, soft substrate bolt-down packages, Printed Circuit Board-based (PCB-based) packages, and over-molded leadframe packages. Over-molded leadframe packages, and particularly quad flat no-lead (QFN) packages, are the least expensive of these package types. The over-molded leadframe package class is known by several terms including, but not limited to, Small Outline Plastic Packages (SOIC), Quarter Size Outline Packages (QSOP), Thin Shrink Small Outline Plastic Packages (TSSOP), Mini Small Outline Plastic Packages (MSOP), Dual Flat No-Lead Plastic Package (DFN), Quad Flat No-Lead Plastic Package (QFN), Small Outline Transistor Plastic Package (SOT), Small Outline Transistor Plastic Packages (SC70-6), Shrink Small Outline Plastic Packages (SSOP), Dual-In-Line Plastic Packages (PDIP), Shrink Dual-In-Line Plastic Packages (SP-DIP), Micro Lead Frame Plastic Package (MLFP), Power Small Outline Plastic Packages (PSOP), Plastic Leaded Chip Carrier Packages (PLCC), Metric Plastic Quad Flatpack Packages (MQFP), Thin Plastic Quad Flatpack Packages (TQFP), Thin Plastic Power Quad Flatpack Packages (PQ-LQFP), Single-In-Line Plastic Packages (SIP), and Ball Grid Array Packages (BGA). These over-molded leadframe packages suffer from significant performance degradation in electrical properties at high frequencies, which limits the use of these packages to frequencies below about 15 GHz. These performance degradations include the losses and impedance mismatches caused by the integrated circuit chip/wirebond/printed circuit board interface.

Typical wirebonding out of a QFN package is generally controlled with a single or double wirebond. The wirebond(s) acts as an inductor, or similar circuit, and it is the inductance created by the wirebond that degrades the performance of a typical QFN package. Therefore, a QFN package that reduces or offsets the inductance created by one or more wirebonds is needed.

SUMMARY OF INVENTION

An electronic device according to various exemplary embodiments of the invention includes a die bond-pad with an integrated circuit chip connected to it. In one exemplary embodiment, a plurality of leads are connected to the die bond-pad, and a wirebond connects the integrated circuit chip to a capacitance lead. In another exemplary embodiment, a second wirebond connects the capacitance lead to an input/output (I/O) lead. In yet another exemplary embodiment, the electronic device includes a third wirebond connecting the capacitance lead to the I/O lead.

In accordance with an aspect of one exemplary embodiment, the first lead is configured to reduce and/or offset the effect of the inductance created by the first wirebond, and the second lead is a radio frequency input/output lead. In another aspect of the invention, the first lead is a low pass filter. In accordance with yet another aspect of one exemplary embodiment, the first wirebond connected to the capacitance lead, and the second wirebond connected to the capacitance lead comprises an inductor-capacitor-inductor topology. In still another aspect of the invention, the inductor-capacitor-inductor topology is configured to reduce and/or offset the effect of the inductance created by any of the wirebonds.

The electronic device, in an exemplary embodiment, includes a third wirebond connecting the capacitance lead to a third lead, wherein the second lead and the third lead are each radio frequency input/output leads, and the capacitance lead is configured to reduce and/or offset the effect of the inductance created by the first wirebond. In accordance with an aspect of one exemplary embodiment, the second lead and the third lead are each adjacent to the capacitance lead. In another aspect of the invention, the second lead and/or the third lead are not adjacent to the capacitance lead.

In another exemplary embodiment, the electronic device includes a molding compound encapsulating the integrated circuit chip, the plurality of leads, the first wirebond, and the second wirebond. In accordance with an aspect of one exemplary embodiment, at least a portion of the first lead is "floating" in the molding compound to form a capacitor when the electronic device is connected to a printed circuit board.

Another electronic device according to various exemplary embodiments of the present invention includes an integrated circuit chip connected to a die bond-pad, a plurality of leads connected to the die bond-pad, a wirebond connecting the integrated circuit chip to a capacitance lead, and a transmission line connecting the capacitance lead to a second lead. In accordance with an aspect of one exemplary embodiment, the capacitance lead is configured to reduce and/or offset the effect of the inductance created by the transmission line, and the second lead is configured to be a radio frequency input/output lead. In accordance with another aspect of the invention, the wirebond connected to the capacitance lead, and the transmission line connected to the capacitance lead comprises an inductor-capacitor-inductor topology. In another aspect of the invention, the inductor-capacitor-inductor topology is configured to reduce and/or offset the effect of the inductance of the electronic device.

A method to reduce an amount of inductance of an electronic device comprised of a die bond-pad including an integrated circuit chip and a plurality of leads connected to the die bond-pad according to various exemplary embodiments of the invention includes the steps of connecting a first wirebond to the integrated circuit chip and a capacitance lead, and connecting a second wirebond to the capacitance lead and a second lead, wherein the second lead is a radio frequency input/output lead.

In another exemplary embodiment, the method includes the step of connecting a third wirebond to the capacitance lead and a third lead, wherein the third lead is a radio frequency input/output lead. In yet another exemplary embodiment, the method includes the steps of calculating, estimating, and/or knowing the inductance created by the first wirebond, and configuring the capacitance lead to offset and/or reduce the effect of the inductance created by the first wirebond. In accordance with an aspect of one exemplary embodiment, the configuring step includes the step of adjusting a size, a volume, a mass, and/or a shape of the capacitance lead.

BRIEF DESCRIPTION OF THE DRAWINGS

A more complete understanding of the present invention may be derived by referring to the detailed description and claims when considered in connection with the drawing Figures, where like reference numbers refer to similar elements throughout the Figures.

DETAILED DESCRIPTION

The detailed description of exemplary embodiments of the invention herein makes reference to the accompanying figures, which show the exemplary embodiment by way of illustration and its best mode. While these exemplary embodiments are described in sufficient detail to enable those skilled in the art to practice the invention, it should be understood that other embodiments may be realized and that logical and mechanical changes may be made without departing from the spirit and scope of the invention. Thus, the detailed description herein is presented for purposes of illustration only and not of limitation. For example, the steps recited in any of the method or process descriptions may be executed in any order and are not limited to the order presented.

For the sake of brevity, functional embodiments of the apparatus and systems (and components of the individual operating components of the systems) may not be described in detail herein. Furthermore, the connecting lines shown in the various figures contained herein are intended to represent exemplary functional relationships and/or physical connections between the various elements. It should be noted that many alternative or additional functional relationships or physical connections may be present in a practical system.

Various embodiments of the invention include, but are not limited to, amplifiers (e.g., power amplifiers, low noise amplifiers, and the like), phase shifters, mixers, switches, and the like. In exemplary embodiments, these electronic devices are configured to reduce and/or offset the undesirable inductance created by the wirebond connection(s) that are generally used to transfer a signal from the integrated circuit chip to a circuit board. By reducing and/or offsetting the effect of the inductance created by the wirebond(s), the performance degradation experienced by current electronic devices is, likewise, reduced and/or substantially eliminated. Therefore, embodiments of the present invention, among other things, enable electronic devices typically used for low frequency applications to be modified and/or manufactured for high frequency applications (e.g., in the range of about five gigahertz (GHz) to about 300 GHz, preferably about 20 GHz to about 40 GHz). In other words, embodiments of the present invention increase the frequency of operation of typical QFN packages.

Figure 1:
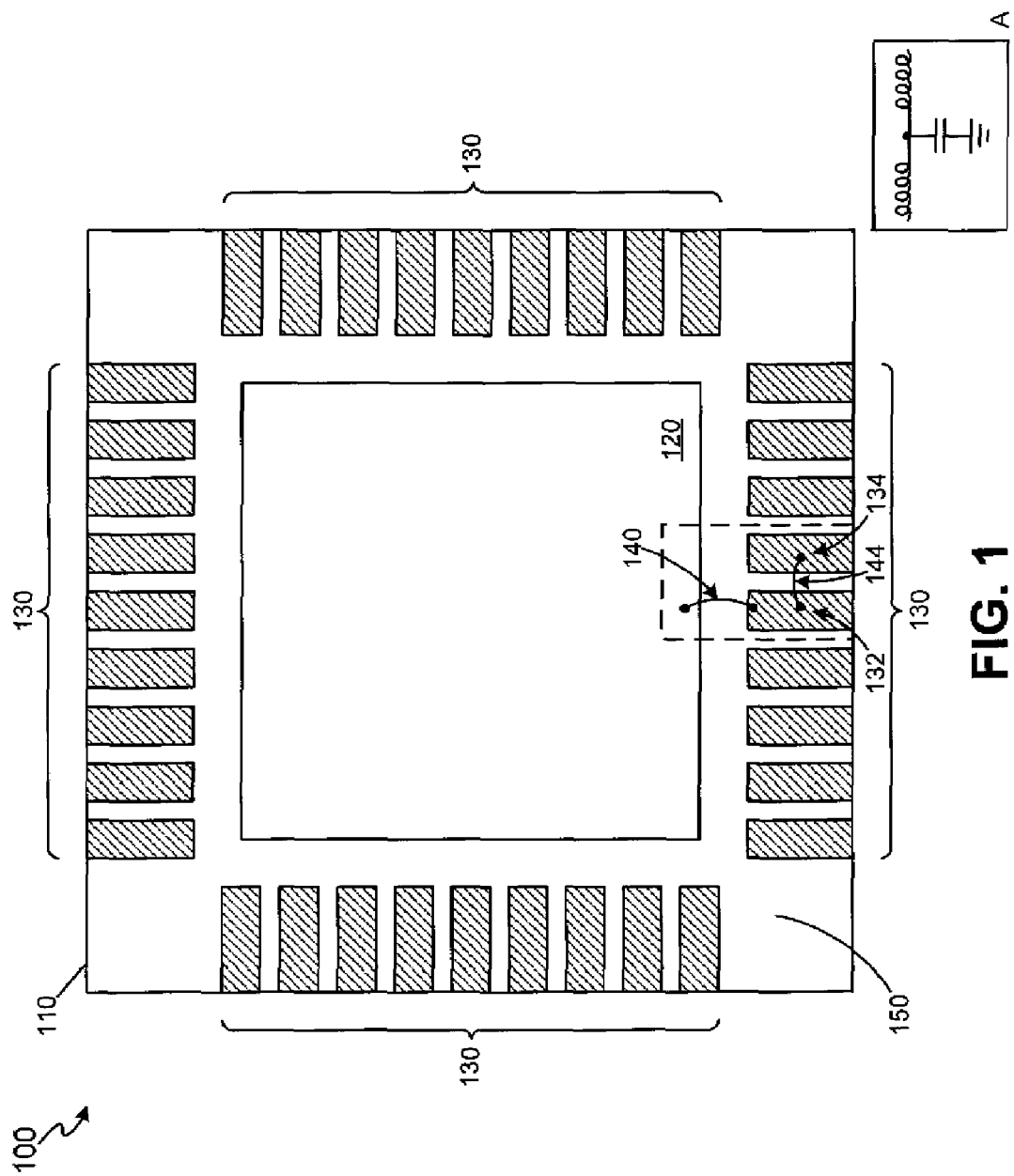
FIG. 1 is a schematic diagram of an exemplary embodiment of a high frequency quad flat no-lead (QFN) package.

Turning now to the figures, FIG. 1 is a schematic diagram of an exemplary embodiment of an over-molded leadframe package, namely, a QFN package 100 capable of operating at high frequencies. QFN package 100 includes a die bond-pad 110, which may be any die bond-pad known in the art or later developed.

In accordance with an exemplary embodiment, QFN package 100 also includes a monolithic microwave integrated circuit ("MMIC") chip 120 connected to die bond-pad 110. MMIC chip 120 may by any monolithic microwave integrated circuit chip known in the art or later developed. In one embodiment, MMIC chip 120 is a monolithic microwave integrated circuit chip operating in frequencies in the Ku frequency band. In another embodiment, MMIC chip 120 is a monolithic microwave integrated circuit chip operating in frequencies greater than the Ku frequency band. In yet another exemplary embodiment, MMIC chip 120 is a monolithic microwave integrated circuit chip operating in the frequency range of about five gigahertz (GHz) to about 300 GHz, and preferably in the frequency range of about 20 GHz to about 40 GHz. In addition, the invention may be used for applications under five GHz and/or applications greater than 300 GHz.

QFN package 100, in another exemplary embodiment, includes a plurality leads 130 connected to die bond-pad 110. As such, QFN package 100 may be any size QFN package known in the art or later developed. For example, QFN package 100 may be as small as a 2×2 (i.e., 2 mm×2 mm) QFN package, and as large as a 15×15 (i.e., 15 mm×15 mm) QFN package. In the exemplary embodiment illustrated in FIG. 1, QFN package 100 is a 6×6 (i.e., 6 mm×6 mm), 36-lead QFN package. Notably, the invention does contemplate that QFN package 100 may be a QFN package larger than 15 mm×15 mm and may include any number of leads.

Leads 130 may be formed of any suitable conductive material known in the art or later developed. For example, leads 130 may be formed of a metal, a metal alloy, and the like. In various exemplary embodiments, leads 130 are formed of copper and/or a copper alloy. In other embodiments, leads 130 are formed of gold and/or a gold alloy. In yet other embodiments, leads 130 are formed of aluminum and/or an aluminum alloy.

In accordance with one exemplary embodiment, QFN package 100 includes at least one capacitance lead 132 connected to MMIC chip 120 via a wirebond 140. Capacitance lead 132 may be suitably configured to reduce and/or offset the effect of inductance created by a wirebond 140 used to transfer signals to and/or from MMIC chip 120. In one exemplary embodiment, capacitance lead is suitably configured to form a capacitor. As such, capacitance lead 132 may be one if at least two metallic plates with a space (i.e., air) and/or a dielectric in between the plates. Furthermore, capacitance lead 132 may include any material known in the art capable of forming a capacitor. In one exemplary embodiment, capacitance lead 132 is suitably configured to reduce and/or offset inductance in the range of about 0.1 nanohenries (nH) to about 1.0 nH, and preferably 0.5 nH. As such, capacitance lead 132 may be suitably configured (e.g., size, shape, material, and the like) to produce a pre-determined, suitable amount of capacitance to reduce and/or offset the inductance created by wirebond 140.

Wirebond 140 may be any device suitably configured to transfer a signal to and/or from MMIC 120. As such, wirebond 140 may be any wirebond known in the art or later developed. As such, wirebond 140 may be formed of any conductive material (e.g., copper, gold, aluminum, silver, and the like). In an aspect of various embodiments, QFN package 100 may include more than one wirebond 140 coupling MMIC 120 to capacitance lead 132.

In another exemplary embodiment, QFN package 100 includes an input/output (I/O) lead 134 coupled to capacitance lead 132 via a wirebond 144. I/O lead 134 may be any device suitably configured to transfer a signal to and/or from QFN package 100. Furthermore, I/O lead 134 may be any I/O lead known in the art or later developed. As such, I/O lead 134 may comprise any of the materials discussed above with respect to leads 130, and may be configured to include any suitable size, shape, height, width, depth, mass, volume, and the like.

Wirebond 144 may be any device suitably configured to transfer a signal to and/or from QFN package 100. As such, wirebond 144 may be any wirebond known in the art or later developed. As such, wirebond 144 may be formed of any conductive material (e.g., copper, gold, aluminum, silver, and the like). In an aspect of various embodiments, QFN package 100 may include more than one wirebond 144 coupling I/O lead 134 to capacitance lead 132.

As shown by the inset in FIG. 1, the configuration of wirebond 140 connected to capacitance lead 132, and capacitance lead 132 connected to wirebond 144 forms an inductor-capacitor-inductor topology (i.e., a three-pole low pass filter). As such, any undesirable inductance created by wirebond 140 and/or 144 may be reduced and/or offset by appropriately configuring capacitance lead 132. Similarly, any undesirable capacitance created by capacitance lead 132 may be reduced and/or offset by appropriately configuring wirebonds 140 and/or 144, preferably wirebond 144.

In accordance with one exemplary embodiment, QFN package 100 includes an over-mold material 150 occupying the area on die 110 not occupied by MMIC 120, leads 130 (including capacitance lead 132 and I/O lead 134), and wirebonds 140 and 144. Over-mold material 150 may be any suitable material for occupying the area on die 110 not occupied by MMIC 120, leads 130 (including capacitance lead 132 and I/O lead 134), and wirebonds 140 and 144. As such, over-mold material 150 may be any suitable over-mold material known in the art or later developed. In one exemplary embodiment, over-mold material 150 is plastic.

Figure 2:
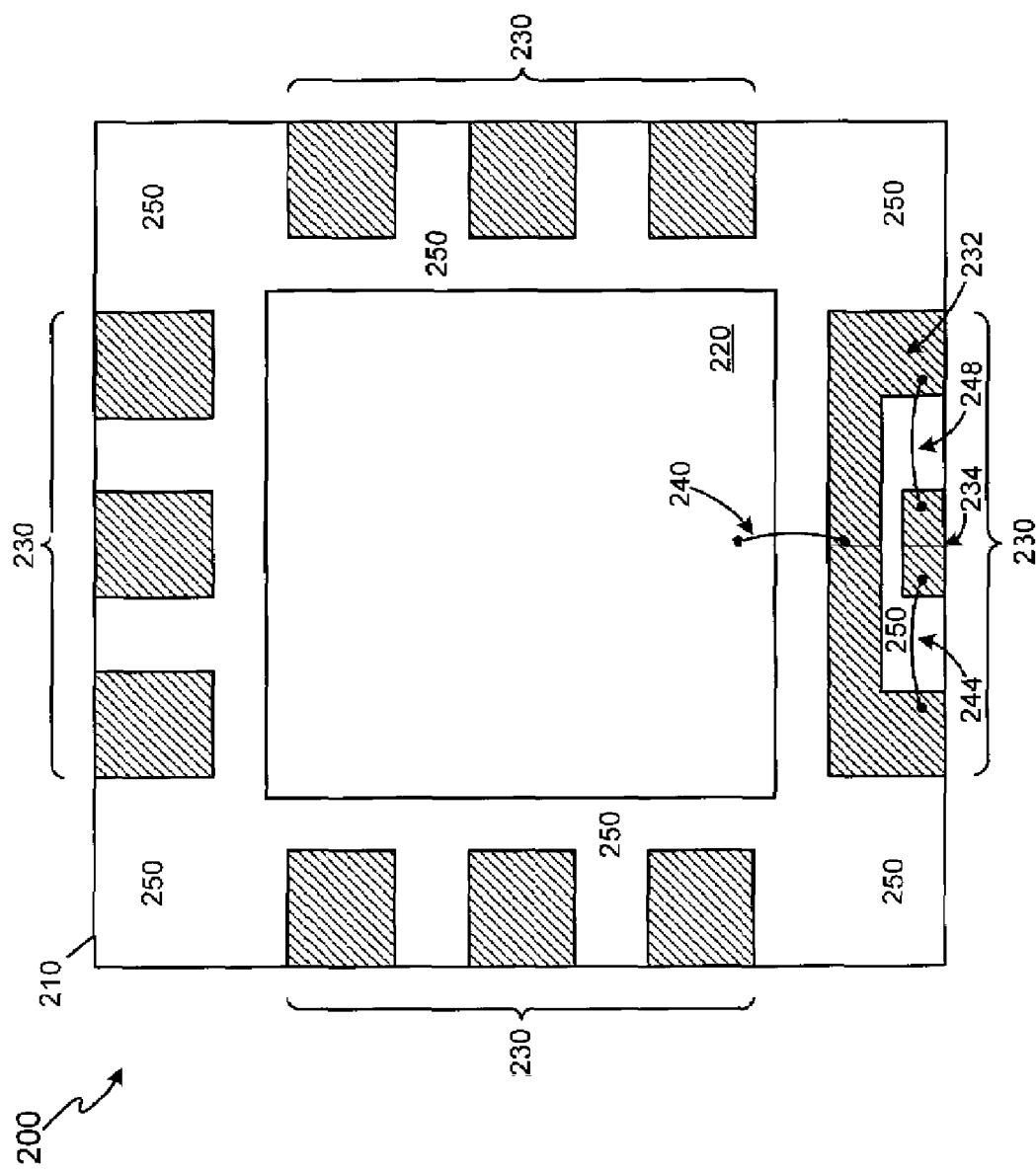
FIG. 2 is a schematic diagram of another exemplary embodiment of a high frequency QFN package.

FIG. 2 is a schematic diagram of another exemplary embodiment of a QFN package 200 capable of operating at high frequencies. In one embodiment, QFN package 200 is a QFN package similar to QFN package 100, discussed above. QFN package 200, in exemplary embodiments, includes a die bond-pad 210 similar to die bond-pad 110, discussed above. Furthermore, QFN package 200, in various embodiments, includes a MMIC chip 220, a plurality leads 230, and an over-mold material 250 similar to MMIC 120, leads 130, and over-mold material 150, discussed above respectively.

In various exemplary embodiments, QFN package 200 also includes a capacitance lead 232 connected to MMIC 220 via a wirebond 240 similar to capacitance lead 132 connected to MMIC 120 via wirebond 140, discussed above. Moreover, QFN package 200 includes an I/O lead 234 connected to capacitance lead 232 via a wirebond 244 similar to I/O lead 134 connected to capacitance lead 132 via a wirebond 144, discussed above.

Capacitance lead 232, in one exemplary embodiment, is configured to include any suitable size, shape, height, width, depth, mass, volume, thickness, material, and the like which may reduce and/or offset the effect of the inductance created by wirebond 240 and/or wirebonds 244, 248. In an aspect of one exemplary embodiment, capacitance lead 232 may be further connected to I/O lead 234 via at least one additional wirebond 248 similar to wirebonds 140, 144, 240, and 244, discussed above. Thus, in accordance with one exemplary embodiment of the invention, QFN package 200 includes another wirebond 248 connecting capacitance lead 232 to I/O lead 234.

Notably, QFN package 200, in various exemplary embodiments, includes any size QFN package known in the art or later developed. Similar to QFN package 100, QFN package 200 may be as small as a 2×2 (i.e., 2 mm×2 mm) QFN package, and as large as a 15×15 (i.e., 15 mm×15 mm) QFN package. In the exemplary embodiment illustrated in FIG. 2, QFN package 200 is a 4×4 (i.e., 4 mm×4 mm), 12-lead QFN package. In addition, the invention does contemplate that QFN package 200 may be a QFN package larger than 15 mm×15 mm and may include any number of leads.

Figure 3:
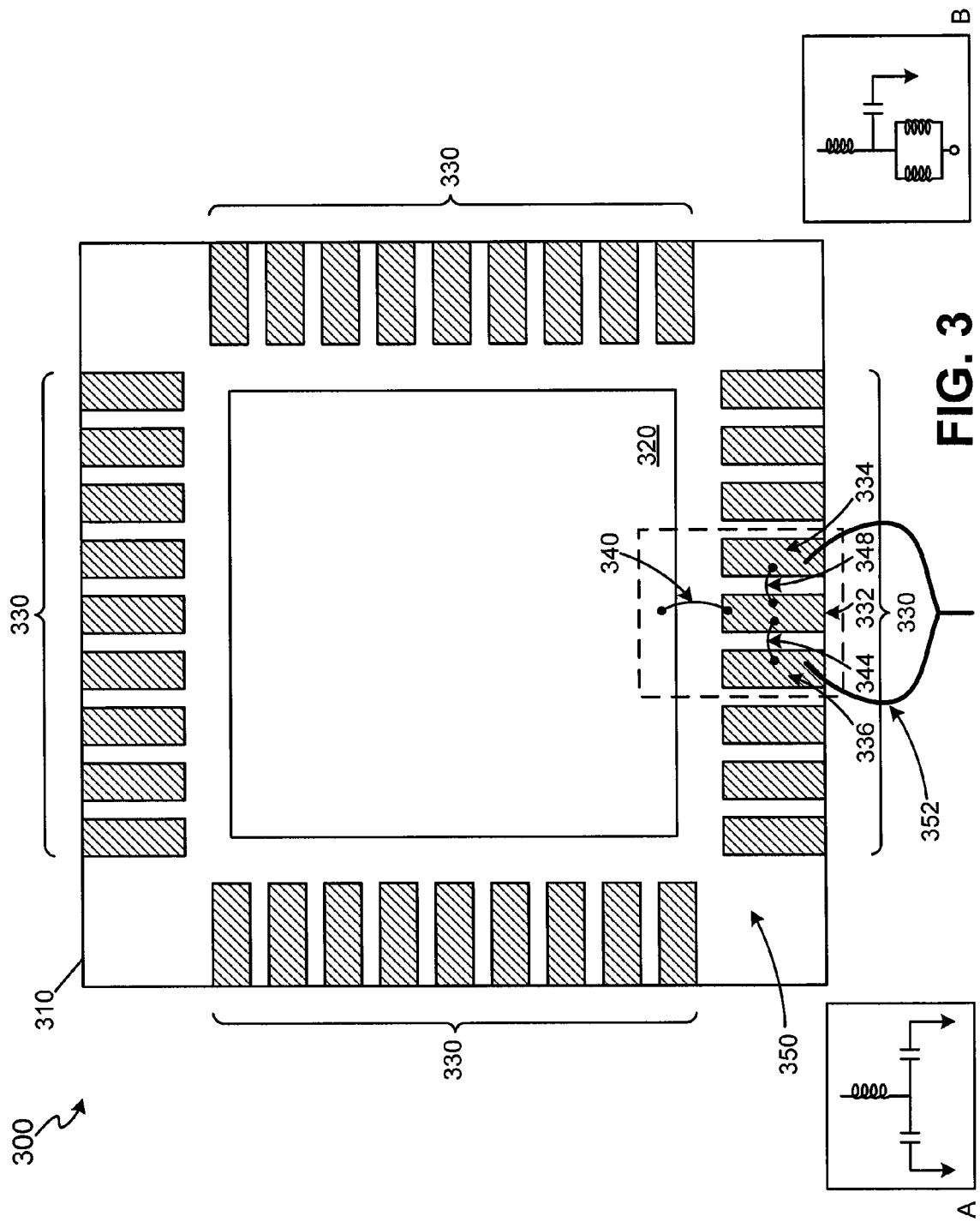
FIG. 3 is a schematic diagram of yet another exemplary embodiment of a high frequency QFN package.

FIG. 3 is a schematic diagram of yet another exemplary embodiment of a QFN package 300 capable of operating at high frequencies. In one embodiment, QFN package 300 is a QFN package similar to QFN package 100, discussed above. QFN package 300, in exemplary embodiments, includes a die bond-pad 310 similar to die bond-pad 110, discussed above. Furthermore, QFN package 300, in various embodiments, includes a MMIC chip 320, a plurality leads 330, and an over-mold material 350 similar to MMIC 120, leads 130, and over-mold material 150, discussed above respectively.

In various exemplary embodiments, QFN package 300 also includes a capacitance lead 332 connected to MMIC 320 via a wirebond 340 similar to capacitance lead 132 connected to MMIC 120 via wirebond 140, discussed above. Moreover, QFN package 300 includes an I/O lead 334 connected to capacitance lead 332 via a wirebond 344 similar to I/O lead 134 connected to capacitance lead 132 via a wirebond 144, discussed above respectively.

In accordance with one exemplary embodiment of the invention, QFN package 300 includes an I/O lead 336 similar to I/O leads 134 and 334, discussed above, connected to capacitance lead 332 via a wirebond 348 similar to wirebonds 140 and 144, discussed above. As set forth in inset A, the configuration of: wirebond 340 connected to capacitance lead 332, capacitance lead 332 connected to wirebond 344, and capacitance lead 332 connected to wirebond 348 forms a three-pole low pass filter (i.e., an L-C-L configuration) when I/O leads 334 and 336 are connected to one another via a wirebond 352 (wherein wirebond 352 is similar to wirebonds 140 and 144, discussed above). As set forth in inset B, the configuration of: wirebond 340 connected to capacitance lead 332, capacitance lead 332 connected to wirebond 344, and capacitance lead 332 connected to wirebond 348 forms a two-pole low pass filter (i.e., an L-C configuration) when I/O leads 334 and 336 are each independently coupled to an external device (not shown). As such, any undesirable inductance created by wirebond 340, 344, and/or 348 may be reduced and/or offset by appropriately configuring capacitance lead 332. Similarly, any undesirable capacitance created by capacitance lead 332 may be reduced and/or offset by appropriately configuring wirebonds 340, 344, and/or 348, preferably wirebond 344 and/or 348. Furthermore, QFN package 300 may include more than 3-poles (L-C-L) for applications utilizing higher bandwidths.

Notably, QFN package 300, in various exemplary embodiments, includes any size QFN package known in the art or later developed. Similar to QFN package 100, QFN package 300 may be as small as a 2×2 (i.e., 2 mm×2 mm) QFN package, and as large as a 15×15 (i.e., 15 mm×15 mm) QFN package. In the exemplary embodiment illustrated in FIG. 3, QFN package 200 is a 10×10 (i.e., 10 mm×10 mm), 28-lead QFN package. In addition, the invention does contemplate that QFN package 300 may be a QFN package larger than 15 mm×15 mm and may include any number of leads.

Figure 4:
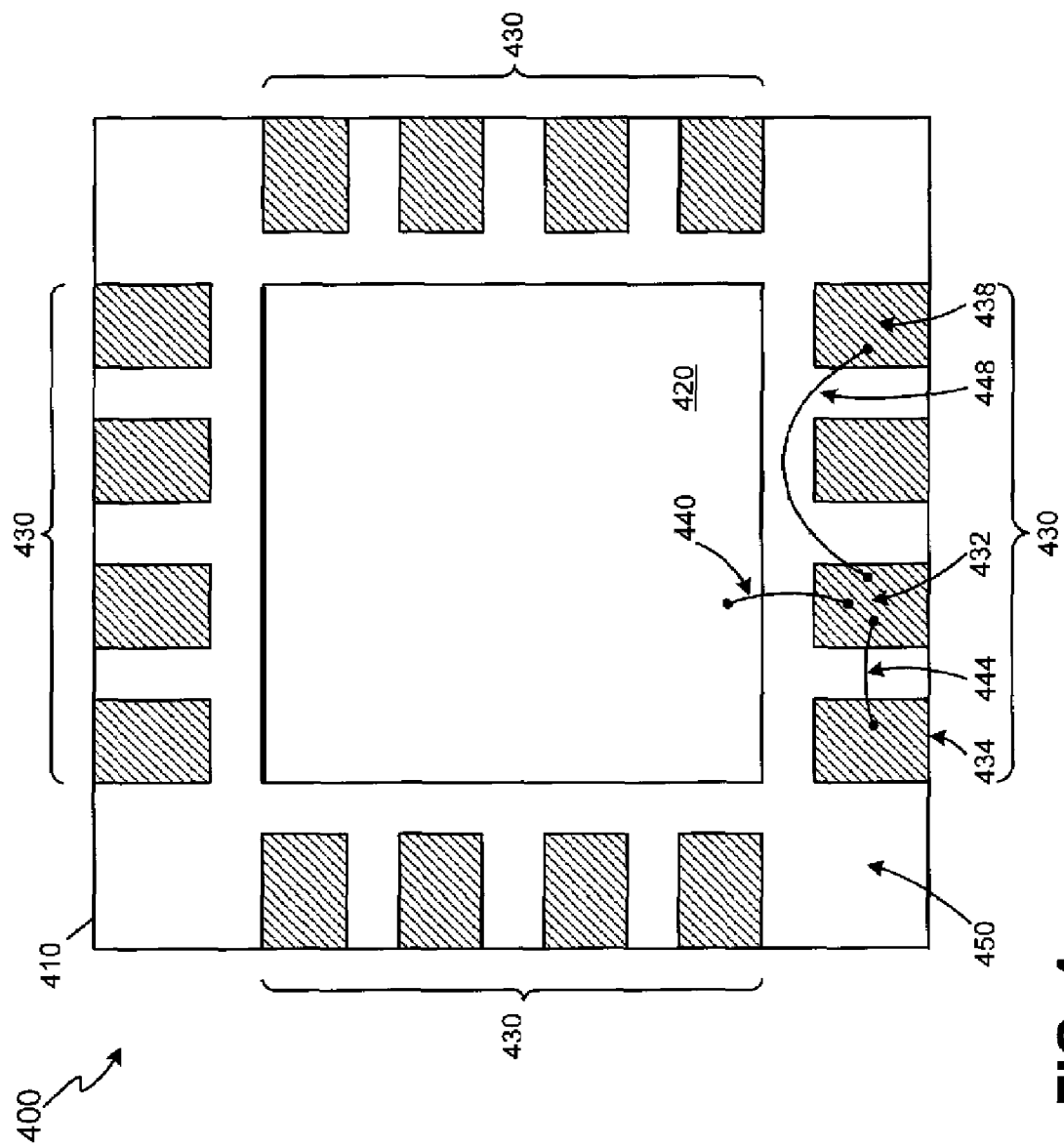
FIG. 4 is a schematic diagram of still another exemplary embodiment of a high frequency QFN package.

FIG. 4 is a schematic diagram of an exemplary embodiment of a QFN package 400 capable of operating at high frequencies. In one embodiment, QFN package 400 is a QFN package similar to QFN package 100, discussed above. QFN package 400, in exemplary embodiments, includes a die bond-pad 410 similar to die bond-pad 110, discussed above. Furthermore, QFN package 400, in various embodiments, includes a MMIC chip 420, a plurality leads 430, and an over-mold material 450 similar to MMIC 120, leads 130, and over-mold material 150, discussed above respectively.

In various exemplary embodiments, QFN package 400 also includes a capacitance lead 432 connected to MMIC 420 via a wirebond 440 similar to capacitance lead 132 connected to MMIC 120 via wirebond 140, discussed above. Moreover, QFN package 400 includes an I/O lead 434 connected to capacitance lead 432 via a wirebond 444 similar to I/O lead 134 connected to capacitance lead 132 via a wirebond 144, discussed above.

In accordance with one exemplary embodiment of the invention, QFN package 400 includes an I/O lead 438 similar to I/O lead 134, discussed above, connected to capacitance lead 432 via a wirebond 448 similar to wirebond 140, discussed above. Similar to QFN package 300, the configuration of wirebond 440 connected to capacitance lead 432, capacitance lead 432 connected to wirebond 444, and capacitance lead 432 connected to wirebond 448 forms a three-pole low pass filter (i.e., L-C-L). As such, any undesirable inductance created by wirebonds 440, 444, and/or 448 may be reduced and/or offset by appropriately configuring capacitance lead 432. Similarly, any undesirable capacitance created by capacitance lead 432 may be reduced and/or offset by appropriately configuring wirebonds 440, 444, and/or 448, preferably wirebond 444 and/or 448. Notably, the present discussion orients I/O lead 438 on the same side of QFN package 400 as capacitance lead 432, however, the invention contemplates that the various I/O leads and/or capacitance leads need not be on the same side of the package with each other and may be ordered in any suitable order on one or more sides.

QFN package 400, in various exemplary embodiments, includes any size QFN package known in the art or later developed. For example, similar to QFN package 100, QFN package 400 may be as small as a 2×2 (i.e., 2 mm×2 mm) QFN package, and as large as a 15×15 (i.e., 15 mm×15 mm) QFN package. In the exemplary embodiment illustrated in FIG. 4, QFN package 400 is a 5×5 (i.e., 5 mm×5 mm), 16-lead QFN package. In addition, the invention does contemplate that QFN package 400 may be a QFN package larger than 15 mm×15 mm and may include any number of leads.

Figure 5:
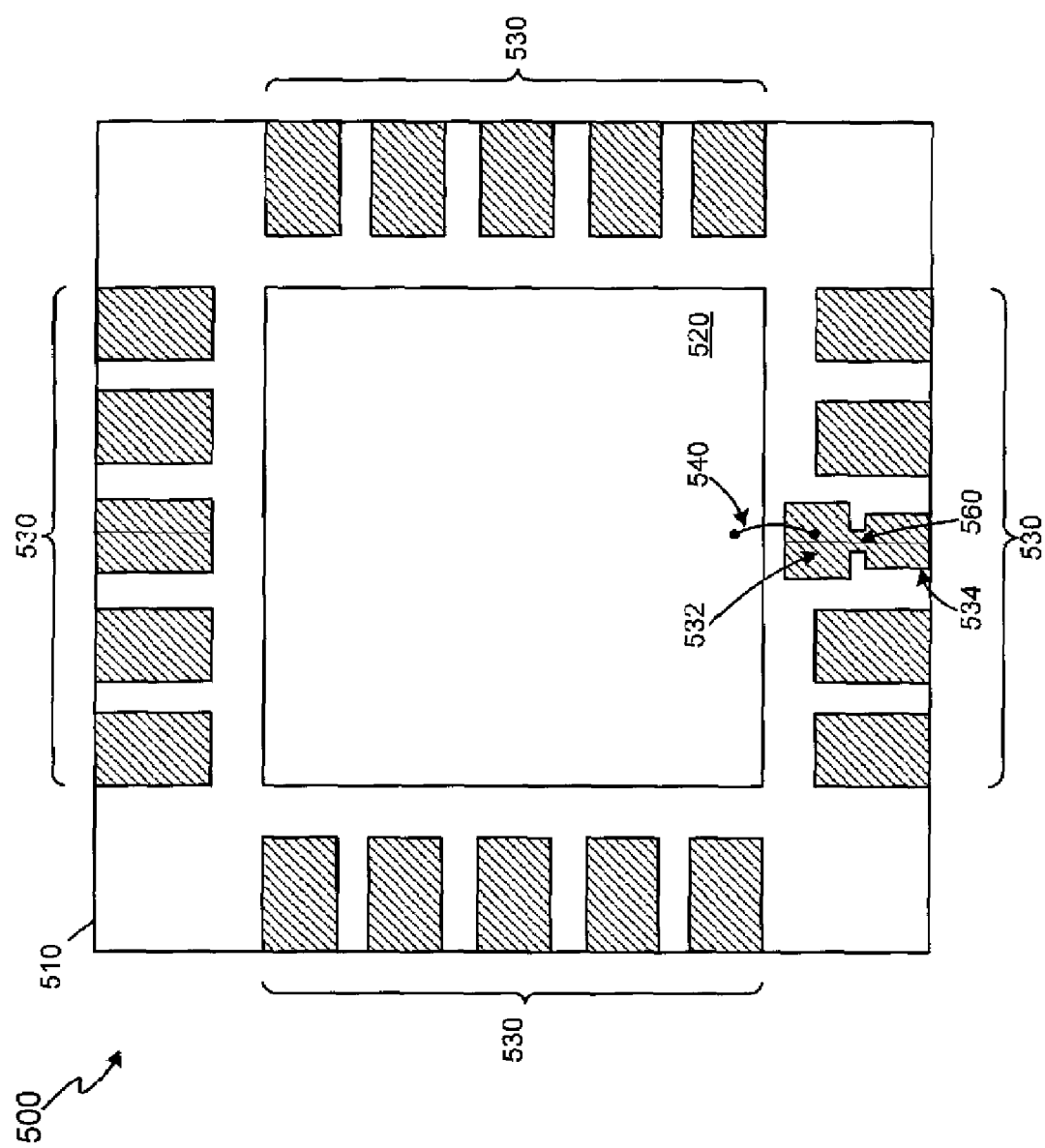
FIG. 5 is a schematic diagram of yet another exemplary embodiment of a high frequency QFN package.

FIG. 5 is a schematic diagram of another exemplary embodiment of a QFN package 500 capable of operating at high frequencies. In one embodiment, QFN package 500 is a QFN package similar to QFN package 100, discussed above. QFN package 500, in exemplary embodiments, includes a die bond-pad 510 similar to die bond-pad 110, discussed above. Furthermore, QFN package 500, in various embodiments, includes a MMIC chip 520, a plurality leads 530, and an over-mold material 550 similar to MMIC 120, leads 130, and over-mold material 150, discussed above respectively.

In one embodiment, QFN package 500 also includes a capacitance lead 532 connected to MMIC 520 via a wirebond 540 similar to capacitance lead 132 connected to MMIC 120 via wirebond 140, discussed above. In accordance with various exemplary embodiments of the invention, QFN package 500 includes an I/O lead 534 connected to capacitance lead 532 via a transmission line 560.

Transmission line 560 may be any device suitably configured to facilitate transfer of a signal between capacitance lead 532 and I/O lead 534. As such, transmission line 560 may be any transmission line known in the art or later developed. As such, transmission line 560 may be formed of any conductive material (e.g., copper, gold, aluminum, silver, and the like). In an aspect of various exemplary embodiments of the invention, transmission line 560 may be formed of substantially the same material as capacitance lead 532 and/or I/O lead 534. In other aspects of the invention, transmission line 560 may be formed of a different material than capacitance lead 532 and/or I/O lead 534. Furthermore, transmission line 560 may include any suitable size, shape, height, width, depth, mass, volume, thickness, material, and the like to facilitate transmission of a signal between capacitance lead 532 and I/O lead 534.

Notably, QFN package 500, in various exemplary embodiments, includes any size QFN package known in the art or later developed. Similar to QFN package 100, QFN package 500 may be as small as a 2×2 (i.e., 2 mm×2 mm) QFN package, and as large as a 15×15 (i.e., 15 mm×15 mm) QFN package. In the exemplary embodiment illustrated in FIG. 5, QFN package 500 is a 7×7 (i.e., 7 mm×7 mm), 20-lead QFN package. In addition, the invention does contemplate that QFN package 200 may be a QFN package larger than 15 mm×15 mm and may include any number of leads.

Figure 6:
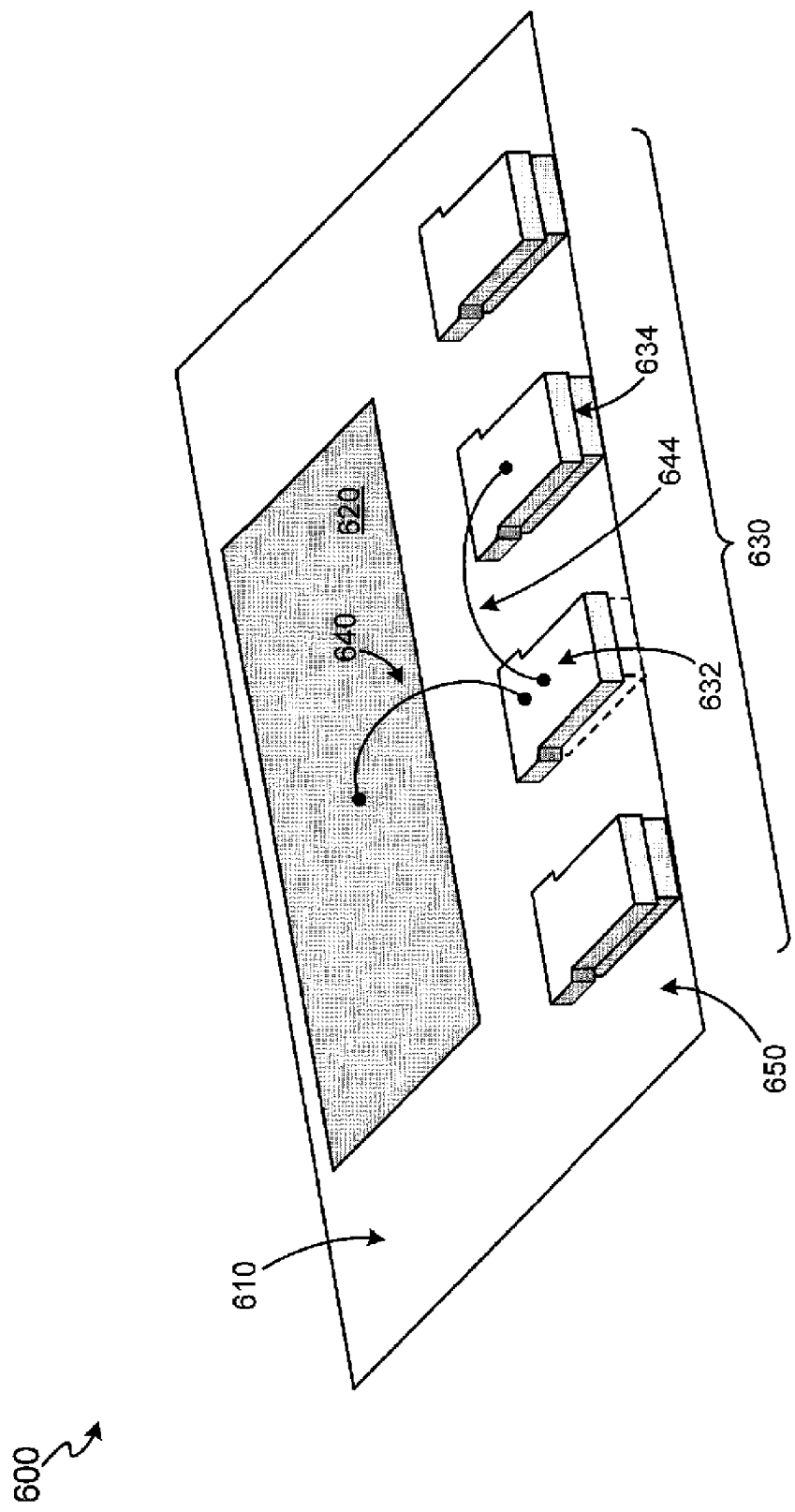
FIG. 6 is a schematic diagram of an exemplary embodiment of a high frequency QFN package including a lead functioning as at least a portion of a capacitor.

FIG. 6 is a schematic diagram of a portion of an exemplary embodiment of a QFN package 600 including a lead functioning as at least a portion of a capacitor. In one embodiment, QFN package 600 is a QFN package similar to QFN package 100, discussed above. QFN package 600, in exemplary embodiments, includes a die bond-pad 610 similar to die bond-pad 110, discussed above. Furthermore, QFN package 600, in various embodiments, includes a MMIC chip 620, a plurality leads 630, and an over-mold material 650 similar to MMIC 120, leads 130, and over-mold material 150, discussed above respectively.

In various exemplary embodiments, QFN package 600 also includes a capacitance lead 632 connected to MMIC 620 via a wirebond 640 similar to capacitance lead 132 connected to MMIC 120 via wirebond 140, discussed above. Moreover, QFN package 600 includes an I/O lead 634 connected to capacitance lead 632 via a wirebond 644 similar to I/O lead 134 connected to capacitance lead 132 via a wirebond 144, discussed above.

Capacitance lead 632, in one exemplary embodiment, is configured to include any suitable size, shape, height, width, depth, mass, volume, thickness, material, and the like which may have the effect of reducing and/or decreasing the effect of the inductance created by wirebond 640 and/or wirebond 644. In an aspect of one exemplary embodiment of the invention, capacitance lead 632 may be "floating" within over-mold material 650 such that capacitance lead 632 forms at least a portion of a capacitor (e.g., a capacitor plate, and air, plastic or other dielectric filler).

QFN package 600, in various exemplary embodiments, includes any size QFN package known in the art or later developed. Similar to QFN package 100, QFN package 600 may be as small as a 2×2 (i.e., 2 mm×2 mm) QFN package, and as large as a 15×15 (i.e., 15 mm×15 mm) QFN package. In the exemplary embodiment illustrated in FIG. 6, QFN package 600 is an 8×8 (i.e., 8 mm×8 mm), 16-lead QFN package. In addition, the invention does contemplate that QFN package 200 may be a QFN package larger than 15 mm×15 mm and may include any number of leads.

Notably, the above discussion of packages 100, 200, 300, 400, 500, and 600 discussed these packages in terms of QFN packages, however, the invention contemplates that QFN packages 100, 200, 300, 400, 500, and 600 may be any over-molded leadframe package. As such, the above discussion is also applicable to, but not limited to, SOIC Packages, QSOP, TSSOP, MSOP, DFN Packages, SOT Packages, SC70-6 Packages, SSOP Packages, PDIP Packages, SPDIP Packages, MLFP Packages, PSOP Packages, PLCC Packages, MQFP Packages, TQFP Packages, PQ-LQFP Packages, SIP Packages, BGA Packages (BGA), and any other over-molded leadframe package.

Figure 7A:
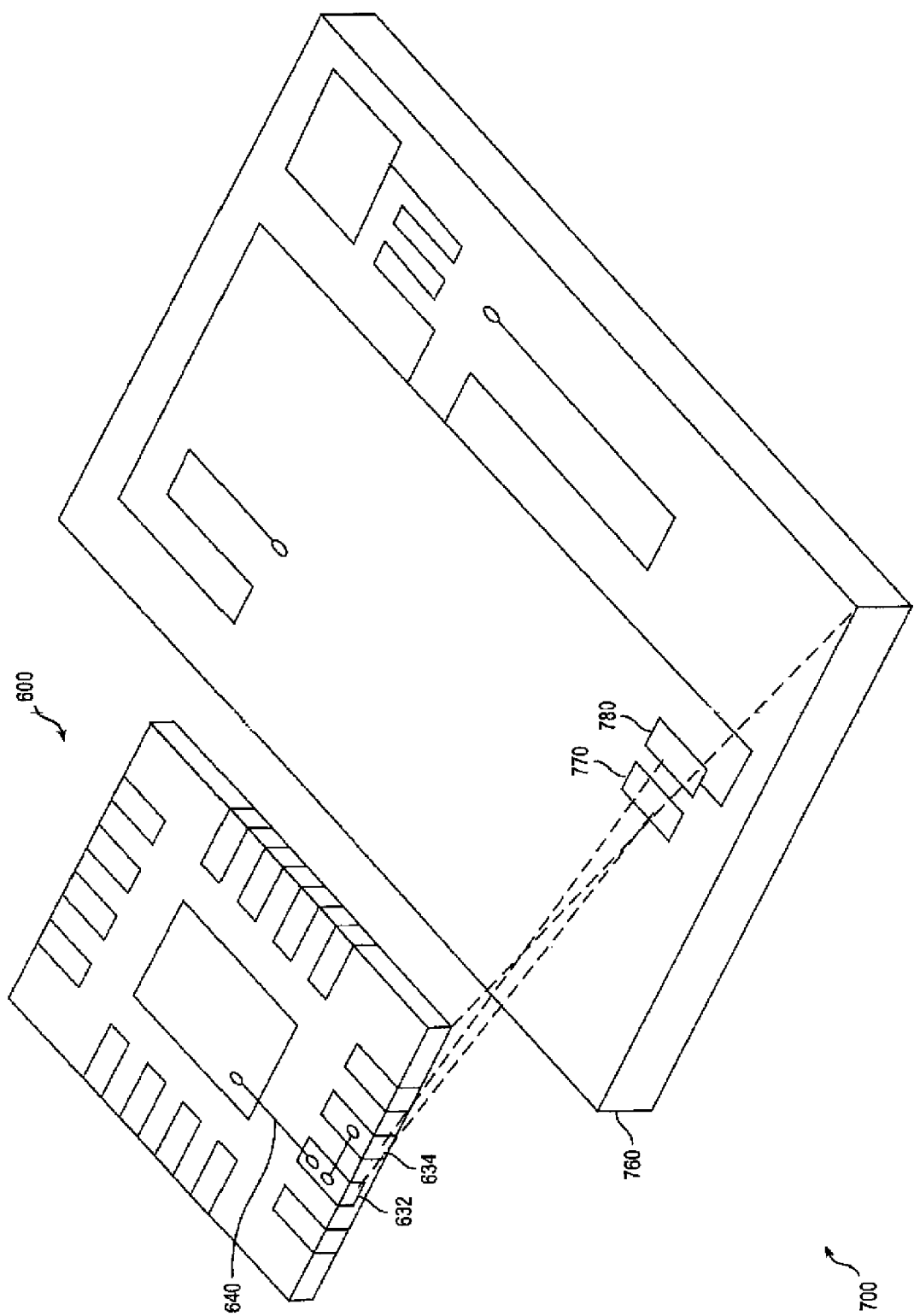
FIGS. 7A and 7B are each perspective views of schematic diagrams of an exemplary system to increase the frequency of operation of the high frequency QFN package of FIG. 6.
Figure 7B:
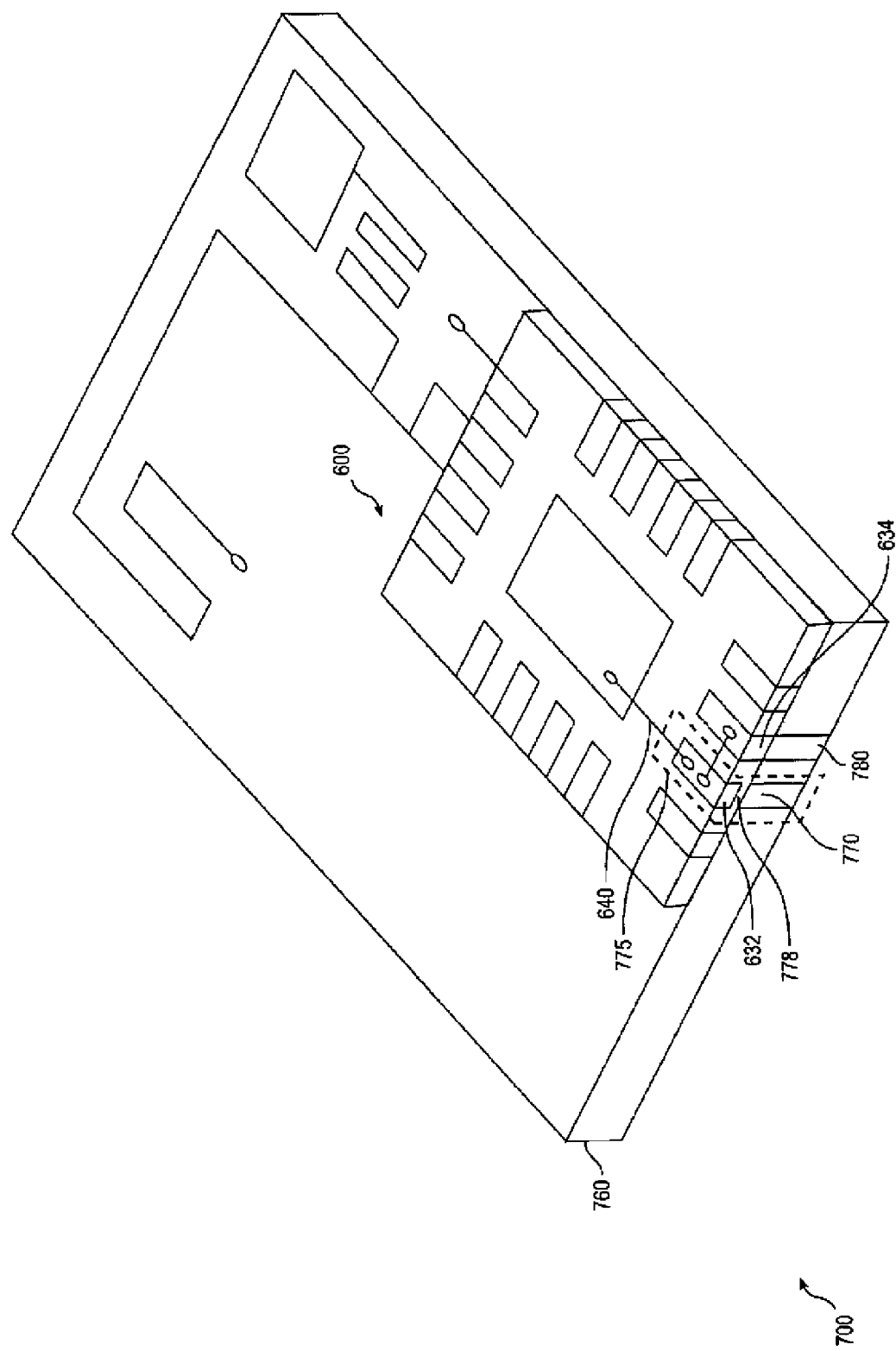

FIGS. 7A and 7B are each a perspective view of schematic diagrams of an exemplary system 700 to increase the frequency of operation of QFN package 600 discussed above. FIG. 7A illustrates QFN package 600 being connected to a printed circuit board (PCB) 760. PCB 760 may be any PCB component or components known in the art capable of utilizing a QFN package.

In one exemplary embodiment, PCB 760 includes capacitance lead 770, which may be formed of any material known in the art capable of forming at least a portion of a capacitor when suitably configured. PCB 760, in another exemplary embodiment, includes I/O lead 780, which may be formed of any known material and may include any shape known in the art capable of transmitting a signal to and/or from QFN package 600.

FIG. 7B illustrates packages 600 connected to PCB 760 such that a completed capacitor 775 is formed. In one embodiment, capacitor 775 is made up of capacitance lead 632, capacitance lead 770, and space (i.e., air, plastic, or other suitable material) 778. As such, capacitance lead 632 forms at least a portion of capacitor 775, capacitance lead 770 forms at least a second portion of capacitor 775, and space 778 forms the necessary gap needed to form capacitor 775. In exemplary embodiments, capacitor 775 is a capacitor is the range of about 0.001 picofarads (pF) to about 0.2 pF, preferably a capacitor of about 0.02 pF. The invention contemplates, however, that capacitor 775 may be any size capacitor to offset and/or reduce the effect of inductance created by wirebond 640, discussed above.

Furthermore, system 700 includes I/O lead 780 similar to lead 634, discussed above. As such, I/O lead 634 may be formed of any material and include any shape known in the art suitable for transmitting a signal to and/or from QFN package 600. Moreover, I/O lead 780 may include any lead suitable for transferring a signal between QFN package 600 and PCB 760.

In addition, though system 700 has been discussed in terms of QFN package 600, system 700 may include a QFN package configured similar to packages 100, 200, 300, 400, and 500, discussed above. As such, capacitance leads, 132, 232, 332, 432, and 532 may be configured such that space 778 would be formed between capacitance leads, 132, 232, 332, 432, and 532, and capacitance lead 770.

Figure 8:
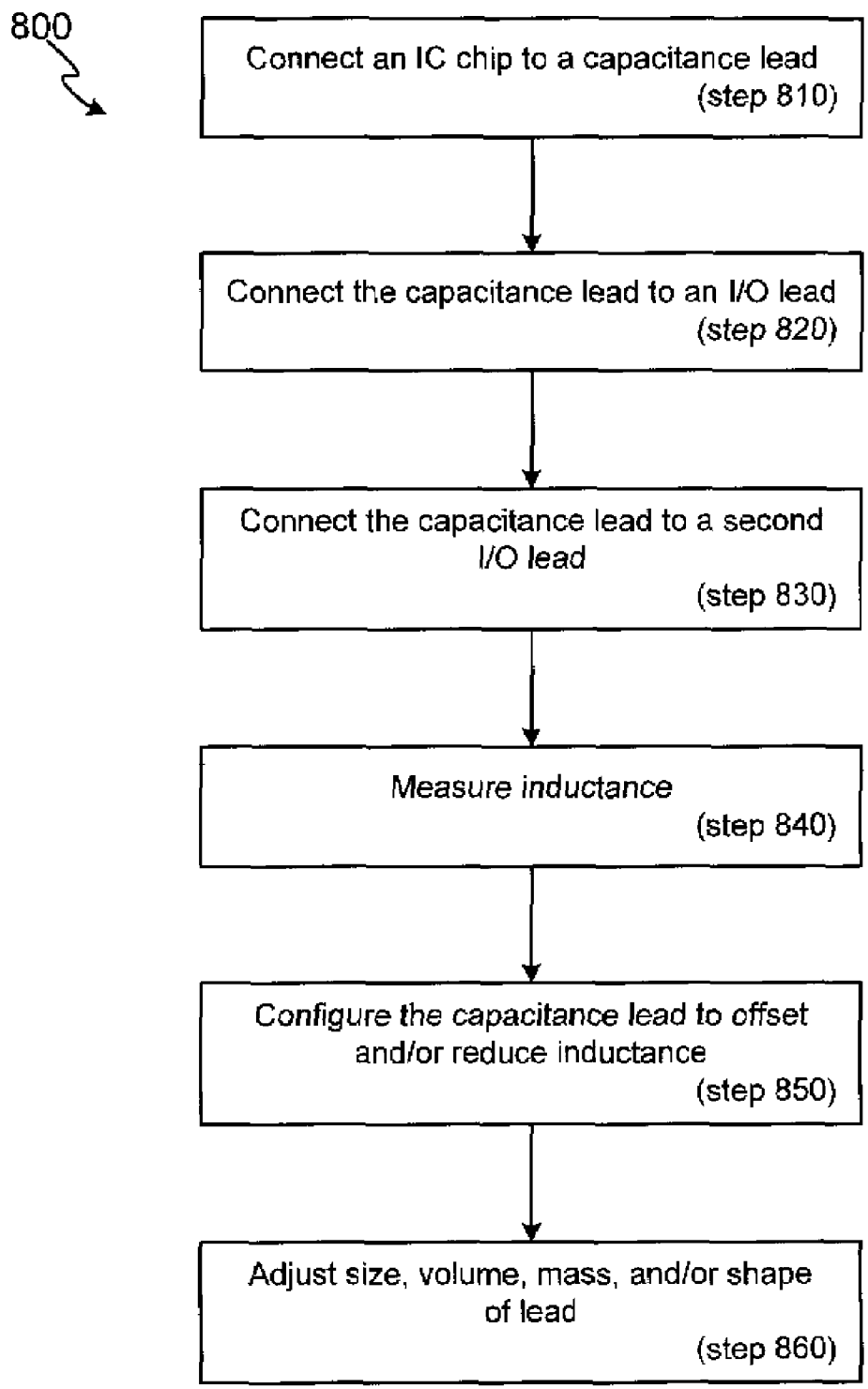
FIG. 8 is a flow diagram of an exemplary method to reduce and/or offset the effect of the inductance of a QFN package.

FIG. 8 is a flow diagram of an exemplary embodiment of a method 800 to reduce and/or offset the effect of the inductance of a QFN package (e.g., QFN packages 100, 200, 300, 400, 500, and 600). In accordance with one exemplary embodiment of the invention, method 800 initiates with connecting an IC chip (e.g., IC chips 120, 220, 320, 420, 520, and 620) to a capacitance lead (e.g., capacitance leads, 132, 232, 332, 432, 532, and 632) via a first wirebond (e.g., wirebonds 140, 240, 340, 440, 540, 640) (step 810). In another exemplary embodiment, the capacitance lead is connected to an I/O lead (e.g., I/O leads, 134, 234, 334, 444, 534, 634) via a second wirebond (e.g., wirebonds 144, 244, 344, 444, and 644) or a transmission line (e.g., transmission line 560) (step 820).

In accordance with various embodiments, the capacitance lead is connected to a second I/O lead (e.g., I/O leads 336 and 438) via a wirebond (e.g., wirebonds 348 and 448) (step 830). In another exemplary embodiment, the inductance created by the first wirebond (i.e., the wirebond connecting the IC chip and the capacitance lead) is measured, estimated, or known (step 840), and the capacitance lead is appropriately configured to substantially reduce and/or substantially offset the effect of the inductance (step 850). In accordance with one aspect of one exemplary embodiment, the size, volume, mass, material, and/or shape of the capacitance lead is adjusted to form a capacitor having any desired capacitance to suitably reduce and/or offset the effect of the inductance created by the first wirebond (step 860).

Benefits, other advantages, and solutions to problems have been described herein with regard to specific embodiments. However, the benefits, advantages, solutions to problems, and any element(s) that may cause any benefit, advantage, or solution to occur or become more pronounced are not to be construed as critical, required, or essential features or elements of any or all the claims or the invention. The scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described exemplary embodiments that are known to those of ordinary skill in the art are expressly incorporated herein by reference and are intended to be encompassed by the present claims.

What is claimed is:

1. An electronic device, comprising:
   a die bond-pad;
   an integrated circuit chip coupled to said die bond-pad;
   a first lead coupled to said die bond-pad;
   a dielectric space defined by said first lead and said die bond-pad wherein said dielectric space extends from said first lead to a surface of said die bond-pad;
   a second lead coupled to said die bond-pad wherein said second lead is flush with the surface of said die bond-pad and wherein said second lead is configured to contact a circuit board and wherein first lead is configured to not contact said circuit board;
   a first wirebond coupling said integrated circuit chip to said first lead wherein said first lead is a capacitance lead configured to reduce and offset an amount of inductance created by said first wirebond; and
   a second wirebond coupling said first lead to said second lead wherein said second lead is a radio frequency input/output lead.

2. The electronic device of claim 1, wherein said first lead is a low pass filter.

3. The electronic device of claim 1, further comprising:
   a third wirebond coupling said first lead to a third lead, wherein said second lead and said third lead are each radio frequency input/output leads, and said first lead is configured to at least one of reduce and offset the effect of inductance created by said first wirebond.

4. The electronic device of claim 3, wherein said second lead and said third lead are each adjacent to said first lead.

5. The electronic device of claim 3, wherein at least one of said second lead and said third lead are not adjacent to said first lead.

6. The electronic device of claim 3, further comprising: a third wirebond coupling said first lead to said second lead.

7. The electronic device of claim 1, wherein said first wirebond coupled to said first lead, and said second wirebond coupled to said first lead comprises an inductor-capacitor-inductor topology.

8. The electronic device of claim 7, wherein said inductor-capacitor-inductor topology is configured to reduce an amount of inductance created by said first wirebond.

9. A computer-readable storage medium which stores therein a control program for causing an image forming device to execute a control method for the image forming device, which comprises an image forming unit, to execute image formation on a recording medium, the control method comprising:
   a writing step of executing at least information writing in a non-contact manner to a non-contact IC chip added to the recording medium; and
   a control step (i) capable of executing both a first mode of executing control so as to change an operation of the image formation by the image forming unit based on whether or not the information writing to the non-contact IC chip was correctly executed in the writing step, and a second mode of executing control so as to cause the image forming unit to execute the image formation to the recording medium to which the non-contact IC chip has been added, irrespective of whether or not the information writing to the non-contact IC chip was correctly executed in the writing step, and (ii) adapted to selectively execute one of the first mode and the second mode.

10. The electronic device of claim 1, further comprising: a molding compound filling the area of said die bond-pad not occupied by at least said integrated circuit chip and said plurality of leads.

11. The electronic device of claim 10, wherein at least a portion of said first lead is floating in said molding compound.

12. The electronic device of claim 1, wherein the electronic device is configured to operate in the range of about five gigahertz (5 GHz) to about (300 GHz).

13. An electronic device, comprising:
   a die bond-pad;
   an integrated circuit chip coupled to said die bond-pad;
   a first lead, a second lead, and a third lead coupled to said die bond-pad;
   a wirebond coupling said integrated circuit chip to a first lead;
   a second wirebond coupling said first lead to said second lead; and
   a third wirebond coupling said first lead to said third lead, wherein said second lead and said third lead are each radio frequency input/output leads, wherein said first lead is a capacitance lead that is not a radio frequency input/output lead, wherein said capacitance lead is configured to at least one of reduce and offset the effect of inductance created by at least one of said first, second, and third wirebonds; and
   wherein said first lead comprises a first plate of a capacitor, and wherein a second plate of said capacitor is not on said die bond-pad.

14. The electronic device of claim 13, wherein said capacitor is only formed when the electronic device is placed in proximity with said second plate and placed such that said second plate is in alignment with said first plate with a space between said first and second plates.

15. The electronic device of claim 13, wherein said capacitor is only formed when the electronic device is placed in proximity with said second plate and placed such that said second plate is in alignment with said first plate with a dielectric between said first and second plates.

16. An electronic device, comprising: a quad flat no-lead package (QFN) wherein said QFN comprises:
   an integrated circuit chip;
   a first lead and a second lead;
   a first wirebond coupling said integrated circuit chip to said first lead;
   a second wirebond coupling said first lead to said second lead; and
   a space defined by said first lead and said QFN wherein said space extends from said first lead to a surface of said QFN, wherein said first lead comprises a first plate of a capacitor, wherein a second plate of said capacitor is not on said QFN, and wherein said first wirebond coupled to said first lead, and said second wirebond coupled to said first lead comprises an inductor-capacitor-inductor topology.

17. The electronic device of claim 16, wherein said first lead is a capacitance lead, wherein said second lead is flush with said surface of said QFN, wherein said second lead is configured to contact a circuit board, and wherein first lead is configured to not contact said circuit board.

18. An electronic system, comprising:
   a circuit board;
   a die bond-pad;
   an integrated circuit chip coupled to said die bond-pad wherein said die bond-pad further comprises a first lead and a second lead;
   wherein said first lead receives an RF signal but is isolated from direct physical contact with said circuit board and said second lead is directly connected to said circuit board for communication of radio frequency signals with said circuit board;
   wherein said circuit board comprises a third lead, wherein said first lead is aligned with said third lead with a space between said first and third leads when said die bond-pad is attached to said circuit board, and wherein said first and third leads and said space comprise a capacitor;
   a first wirebond coupling said integrated circuit chip to said first lead wherein said first lead is a capacitance lead configured to at least one of reduce and offset an amount of inductance created by said first wirebond; and
   a second wirebond coupling said first lead to said second lead wherein said second lead is a radio frequency input/output lead.

19. An electronic system comprising:
   a printed circuit board (PCB) comprising a first capacitance lead;
   a quad flat no-lead package (QFN) attached to the PCB wherein the QFN comprises a second capacitance lead aligned with said first capacitance lead; wherein said QFN is configured to form a space between said first capacitance lead and said second capacitance lead when said QFN is attached to said PCB; and wherein said first capacitance lead, said space, and said second capacitance lead form a capacitor.

20. The electric system of claim 19, wherein said space is filled with a dielectric material.

21. The electric system of claim 19, wherein said PCB further comprises a first RF input/output lead and wherein said QFN further comprises a second RF input/output lead configured to be aligned with said first RF input/output lead and configured to communicate an RF signal between said QFN and said PCB; and wherein said second capacitance lead is connected to said first RF input/output lead by a wirebond.

22. The electronic device of claim 19, wherein said space is air.

* * * * *